US008026567B2

(12) United States Patent
Chang et al.

(10) Patent No.: US 8,026,567 B2
(45) Date of Patent: Sep. 27, 2011

(54) THERMOELECTRIC COOLER FOR SEMICONDUCTOR DEVICES WITH TSV

(75) Inventors: Shih-Cheng Chang, Hsin-Chu (TW); Hsin-Yu Pan, Taipei (TW)

(73) Assignee: Taiwan Semiconductor Manufactuirng Co., Ltd., Hsin-Chu (TW)

( * ) Notice: Subject to any disclaimer, the term of this patent is extended or adjusted under 35 U.S.C. 154(b) by 302 days.

(21) Appl. No.: 12/341,732

(22) Filed: Dec. 22, 2008

(65) Prior Publication Data
US 2010/0155700 A1 Jun. 24, 2010

(51) Int. Cl.
*H01L 35/30* (2006.01)
*H01L 23/38* (2006.01)
*H01L 35/16* (2006.01)
*H01L 35/26* (2006.01)
*H01L 23/373* (2006.01)
*H01L 29/06* (2006.01)
*H01L 23/522* (2006.01)

(52) U.S. Cl. ......... 257/467; 257/E31.131; 257/E29.005; 257/15; 257/930; 257/773; 257/774; 257/680; 438/54; 136/201; 136/203; 136/242; 136/238; 136/240; 62/3.3; 62/3.61; 62/3.7

(58) Field of Classification Search ............. 257/15, 257/773, 774, 680, E31.131, E29.005, 467, 257/930; 438/54; 136/201, 203, 242, 238, 136/240; 62/3.3, 3.61, 3.7
See application file for complete search history.

(56) References Cited

U.S. PATENT DOCUMENTS

| 5,452,206 | A  | * | 9/1995  | Turrietta et al. .............. 715/236 |
|-----------|----|---|---------|----------------------------------------|
| 6,614,109 | B2 | * | 9/2003  | Cordes et al. .................. 257/712 |
| 6,696,635 | B2 | * | 2/2004  | Prasher ......................... 136/201 |
| 6,981,380 | B2 | * | 1/2006  | Chrysler et al. .................. 62/3.2 |
| 7,196,411 | B2 |   | 3/2007  | Chang ............................ 257/706 |
| 7,342,169 | B2 |   | 3/2008  | Venkatasubramanian et al. .......................... 136/236.1 |
| 7,638,705 | B2 | * | 12/2009 | Venkatasubramanian .... 136/206 |
| 7,679,203 | B2 | * | 3/2010  | Bharathan et al. ............ 136/200 |
| RE41,801  | E  | * | 10/2010 | Venkatasubramanian ........ 438/3 |
| 2004/0018729 | A1 | * | 1/2004  | Ghoshal et al. ............... 438/689 |
| 2004/0262745 | A1 | * | 12/2004 | Cordes et al. .................. 257/713 |
| 2007/0252257 | A1 |   | 11/2007 | Baek et al. ..................... 257/678 |
| 2009/0020148 | A1 | * | 1/2009  | Boukai et al. .................. 136/201 |
| 2009/0173976 | A1 | * | 7/2009  | Augusto ........................ 257/292 |
| 2010/0008620 | A1 | * | 1/2010  | Chang et al. .................... 385/14 |

OTHER PUBLICATIONS

Fan, Xiaofeng et al., "SiGeC/Si superlattice microcoolers", Applied Physics Letters, vol. 78, No. 11, pp. 1580-1582, Mar. 2001.
Shakouri, Ali, "Nanoscale Thermal Transport and Microrefrigerators on a Chip", Proceedings of the IEEE, vol. 94, No. 8, pp. 1613-1638, Aug. 2006.
Zhang, Yan et al., "On-Chip High Speed Localized Cooling Using Superlattice Microrefrigerators", IEEE Transactions on Components and Packaging Technologies, vol. 29, No. 2, Jun. 2006, pp. 395-401.

* cited by examiner

*Primary Examiner* — A Williams
(74) *Attorney, Agent, or Firm* — K&L Gates LLP

(57) ABSTRACT

A thermoelectric structure for cooling an integrated circuit (IC) chip comprises a first type superlattice layer formed on top of the IC chip connected to a first voltage, and a second type superlattice layer formed on the bottom of the IC chip connected to a second voltage, the second voltage being different from the first voltage, wherein an power supply current flows through the first and second type superlattice layer for cooling the IC chip.

19 Claims, 2 Drawing Sheets

THERMOELECTRIC COOLER FOR SEMICONDUCTOR DEVICES WITH TSV

BACKGROUND

The present invention relates generally to heat dissipation in semiconductor devices, and, more particularly, to a cooling device employing thermoelectric structures and through-silicon-via (TSV).

As semiconductor process technology progresses, more and more devices can be integrated in a given die size, and at the same time the integrated circuit (IC) can run at greater clock speed (higher frequency). This results in higher power dissipation thus an increase in the die temperature. The increased die temperature will directly affect the performance of the IC due to mobility degradation at high temperature. Long term wise, the quality and reliability of the IC will also be affected due to electromigration and oxide breakdown. The lifetime of IC devices exponentially decrease with the increasing die temperature.

IC chips are conventionally cooled by fans, heat sinks, circulated liquids or thermoelectric effects. The fans, heat sinks and circulated liquids are often time very bulky and may not effectively reduce uneven temperature distribution within the IC chip. The circulated liquids, additionally, have a leakage problem over time. The thermoelectric effect refers to a temperature difference created by an electric potential. However, running electricity itself generates Joule heating which undermines the thermoelectric cooling effect, and lowers the cooling efficiency thereof.

As such, what is desired is an efficient heat dissipation packaging system utilizing thermoelectric cooling that does not contribute extra Joule heating and is easy to assemble and occupies less space.

SUMMARY

This invention discloses a thermoelectric structure for cooling an integrated circuit (IC) chip, the thermoelectric structure comprises a first type superlattice layer formed on top of the IC chip connected to a first voltage, and a second type superlattice layer formed on the bottom of the IC chip connected to a second voltage, the second voltage being different from the first voltage, wherein an power supply current flows through the first and second type superlattice layer for cooling the IC chip. If the first type superlattice layer is a P type, then the second type superlattice layer is an N type, and a ground power supply voltage is connected to the P type superlattice layer, while a high voltage power supply voltage is connected to the N type superlattice layer.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses a thermoelectric cooling system that has a superlattice cooling structure and dissipates heat using chip's main power supply. The thermoelectric cooling system in accordance with the present invention benefits from flip-chip package structure and through-silicon-via (TSV) technology.

Figure 1:
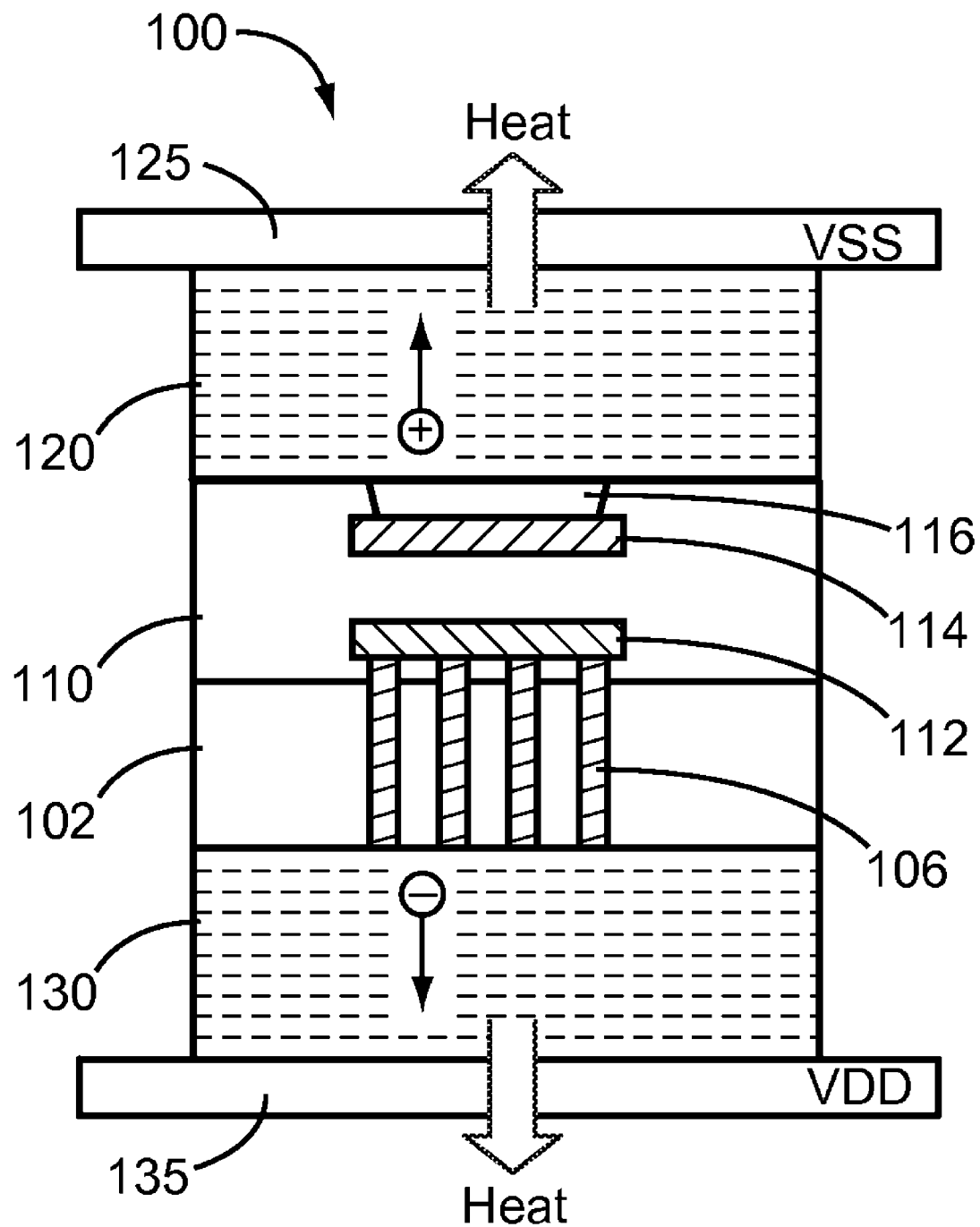
FIG. 1 is a cross-sectional view of a thermoelectric cooler for an IC chip according to one embodiment of the present invention.

FIG. 1 is a cross-sectional view of a thermoelectric cooler for an IC chip 100 according to one embodiment of the present invention. The IC chip 100 includes a substrate 102 and a processed layer 110 typically comprising of deposited polysilicon layers and metal interconnects sandwiched in dielectric layers. According to the present invention, a thermoelectric structure for cooling the IC chip comprises at least two superlattice layers formed on top of the IC chip and on the bottom of the IC chip, respectively. A first superlattice layer 120 is formed on top of the processed layer 110 and connected to a ground (VSS) plane 114 inside the processed layer 110 through a contact 116. Then a VSS metal layer 125 is deposited on the first superlattice layer 120 for supplying power to the chip 100. A second superlattice layer 130 is formed at the bottom of the substrate 102 and connected to a high voltage power supply (VDD) plane 112 inside the processed layer 110 through a plurality of through-silicon-vias (TSVs) 106. Then a VDD metal layer 135 is deposited at the bottom of the second superlattice layer 130 for supplying power to the chip 100. During an operation of the chip 100, the main power current flows in from the VDD metal layer 135 through the second superlattice layer 130 and the TSVs 106 to the VDD plane 112, and flows out from the VSS plane 114, through the contact 116 and the first superlattice layer 120 to the VSS metal layer 125.

The superlattice layer 120 or 130 is a material with periodically alternating layers of several substances. For instance, a superlattice layer can be grown from layers of Si and layers of SiGe with a molecular beam epitaxy (MBE) machine. In accordance with the present invention, the first superlattice layer 120 is P-type and may be exemplarily formed by alternating layers of $Bi_2Te_3$ and $Sb_2Te_3$, so that holes in the first superlattice 120 serve as a refrigerant. The holes drift in the same direction as the current, i.e., from the bottom to the top of the first superlattice layer 120. Thereby heat generated by the chip 100 will be actively dissipated to the ambient by the first superlattice 120. The second superlattice layer 130, on the other hand, is N-type and may be exemplarily formed by alternating layers of $Bi_2Te_3$ and $Bi_2Te_{2.83}Se_{0.17}$, so that electrons in the second superlattice 130 serve as a refrigerant. The electrons drift in the opposite direction as the current, i.e., from the top to the bottom of the second superlattice 130. Thereby heat generated by the chip 100 will also be actively dissipated to the ambient by the second superlattice 130.

In constructing the chip 100, a skilled in the art may apply a first buffer layer (not shown) between the processed layer 110 and the first superlattice layer 120, as well as a second buffer layer (also not shown) between the substrate 102 and the second superlattice layer 130. The first buffer layer may have the same doping concentration as the first superlattice layer 120 for reducing strain due to lattice mismatch between the processed layer 110 and the first superlattice layer 120. Similarly, the second buffer layer may have the same doping concentration as the second superlattice layer 130 for reducing strain due to lattice mismatch between the substrate 102 and the second superlattice layer 130.

It is well known that when current is sent through a circuit made of dissimilar materials, such as the first and second superlattice layer 120 and 130 of FIG. 1, heat will be absorbed at one junction and given up at the other according to the Peltier effect. The chip 100 according to the embodiment of the present invention is cooled from both top and bottom, and it is done so by the chip's main power supply without involving additional Joule heating. Besides, the first and second superlattice layers 120 and 130 can block ambient heat from conducting back into the chip 100 due to thermal conductivity reduction and phonon localization like behavior in superlattice structures.

Cooling efficiency can be measured by figure-of-merit (Z) which has an expression:

$$Z = \frac{(\text{Seebeck\_coefficient})^2 (\text{electrical\_conductivity})}{(\text{thermal\_conductivity})}. \quad \text{Eq. 1}$$

In Eq. 1, the electrical_conductivity is improved by the large areas of the superlattice layers 120 and 130 which reduce the resistance in conducting the main power supply to the chip 100. At the same time, the thermal_conductivity is reduced due to the blocking of the feedback heating by the superlattice layers 120 and 130. Therefore the Z and hence the cooling efficiency of the chip 100 with the sandwiched superlattice structure is very high.

Figure 2:
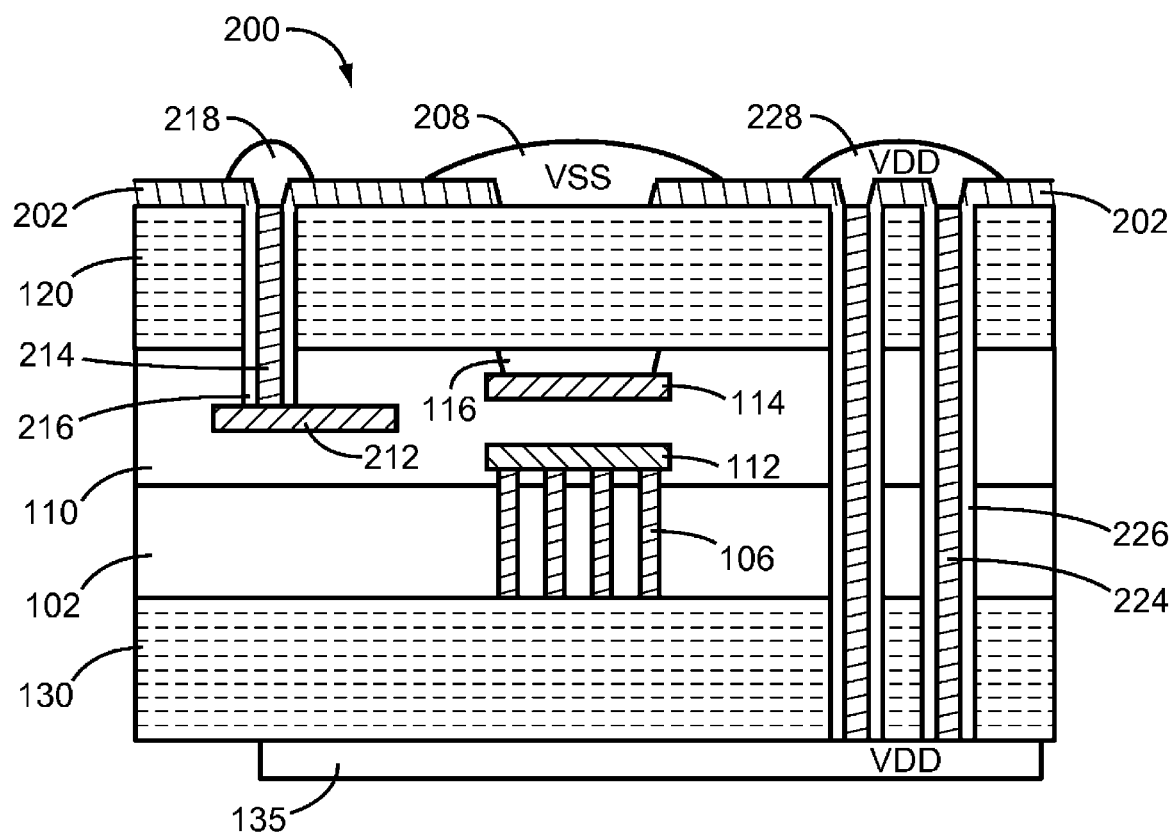
FIG. 2 is a cross-sectional view of a thermoelectric cooler for a flip-chip according to another embodiment of the present invention.

FIG. 2 is a cross-sectional view of a thermoelectric cooler for a flip-chip 200 according to another embodiment of the present invention. In the flip-chip 200, superlattice layers 120 and 130 are also formed on the top and bottom, respectively, of the chip 200. The superlattice layers 120 and 130 provide the Z enhancement to the chip 200 as described earlier. Since solder balls in the flip-chip 200 are all located on one side of the chip, the VDD metal layer 135 needs to be connected to the top of the chip 200. Here a plurality of TSVs 224 is employed to connect the VDD metal layer 135 to the VDD solder ball 228. The plurality of TSVs 224 is insulated by a dielectric layer 226 formed during the TSV process. A VSS solder ball 208 conducts the VSS voltage to the superlattice layer 120. An exemplary signal line 212 inside the processed layer 110 is connected to a signal solder ball 218 through a TSV 214 which is insulated by a dielectric layer 216. The various solder balls are insulated by a dielectric layer 202. The flip-chip 200 demonstrates that the sandwiched thermoelectric cooling structure shown in FIG. 2 as well as FIG. 1 in accordance with present invention is very easy to fabricate with the TSV process.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A thermoelectric structure for cooling an integrated circuit (IC) chip, the thermoelectric structure comprising:
    a first type superlattice layer formed on top of the IC chip connected to a first voltage; and
    a second type superlattice layer formed on the bottom of the IC chip connected to a second voltage, the second voltage being different from the first voltage,
    wherein an active conducting current flows through the first and second type superlattice layer for cooling the IC chip.

2. The thermoelectric structure of claim 1, wherein the first type superlattice layer is a P type, the second type superlattice layer is an N type and the second voltage is higher than the first voltage.

3. The thermoelectric structure of claim 1, wherein the first type superlattice layer is an N type, the second type superlattice layer is a P type and the second voltage is lower than the first voltage.

4. The thermoelectric structure of claim 1, wherein the first and the second type superlattice layers are connected to a first and a second main power supply metal layers, respectively, in the IC chip, wherein the active conducting current is a power supply current of the IC chip.

5. The thermoelectric structure of claim 1 further comprising a top metal layer formed at the top of the first superlattice layer, wherein the first voltage is provided to the top metal layer.

6. The thermoelectric structure of claim 1 further comprising a bottom metal layer formed at the bottom of the second superlattice layer, wherein the second voltage is provided to the bottom metal layer.

7. The thermoelectric structure of claim 6 further comprising one or more through-silicon-vias connecting the bottom metal layer to one or more solder balls, respectively, on top of the first superlattice layer.

8. A thermoelectric structure for cooling an integrated circuit (IC) chip, the thermoelectric structure comprising:
    a P type superlattice layer formed on top of the IC chip connected to a first voltage; and
    an N type superlattice layer formed on the bottom of the IC chip connected to a second voltage, the second voltage being higher than the first voltage,
    wherein an active conducting current flows through the N type and the P type superlattice layer for cooling the IC chip.

9. The thermoelectric structure of claim 8, wherein the P type superlattice layer is connected to a ground power supply (VSS) metal layer in the IC chip, and the N type superlattice layer is connected to a high voltage power supply (VDD) metal layer in the IC chip, wherein the active conducting current is a power supply current of the IC chip.

10. The thermoelectric structure of claim 8 further comprising a signal line connected to a signal solder ball formed at the top of the P type superlattice layer via a through-silicon-via.

11. The thermoelectric structure of claim 8 further comprising a top metal layer formed at the top of the P type superlattice layer, wherein the first voltage is provided to the top metal layer.

12. The thermoelectric structure of claim 8 further comprising a bottom metal layer formed at the bottom of the N type superlattice layer, wherein the second voltage is provided to the bottom metal layer.

13. The thermoelectric structure of claim 12 further comprising one or more through-silicon-vias connecting the bottom metal layer to one or more solder balls on top of the P type superlattice layer.

14. A thermoelectric structure for cooling an integrated circuit (IC) chip, the thermoelectric structure comprising:
   an N type superlattice layer formed on top of the IC, chip connected to a first voltage; and
   a P type superlattice layer formed on the bottom of the IC chip connected to a second voltage, the second voltage being lower than the first voltage,
   wherein an active conducting current flows through the N type and the P type superlattice layer for cooling the IC chip.

15. The thermoelectric structure of claim 14, wherein the N type superlattice layer is connected to a high voltage power supply (VDD) metal layer in the IC chip, and the P type superlattice layer is connected to a ground power supply (VSS) metal layer in the IC chip, wherein the active conducting current is a power supply current of the IC chip.

16. The thermoelectric structure of claim 14 further comprising a signal line connected to a signal solder ball formed at the top of the N type superlattice layer via a through-silicon-via.

17. The thermoelectric structure of claim 14 further comprising a top metal layer formed at the top of the N type superlattice layer, wherein the first voltage is provided to the top metal layer.

18. The thermoelectric structure of claim 14 further comprising a bottom metal layer formed at the bottom of the P type superlattice layer, wherein the second voltage is provided to the bottom metal layer.

19. The thermoelectric structure of claim 18 further comprising one or more through-silicon-vias connecting the bottom metal layer to one or more solder balls on top of the N type superlattice layer.

* * * * *